United States Patent
Rochel et al.

[11] Patent Number: 5,946,188
[45] Date of Patent: Aug. 31, 1999

[54] CAR AMPLIFIER INCORPORATING A PELTIER DEVICE FOR COOLING

[75] Inventors: Sohail Rochel, Los Angeles; Gene Edgar Norvell, Huntington Beach, both of Calif.

[73] Assignee: Epsilon Electronics, Inc., Commerce, Calif.

[21] Appl. No.: 09/124,247

[22] Filed: Jul. 29, 1998

[51] Int. Cl.$^6$ .................................................... H05K 7/20
[52] U.S. Cl. ....................... 361/690; 361/695; 165/80.3; 165/80.2; 174/16.1; 174/16.3
[58] Field of Search ................... 361/690, 694, 361/695, 704, 707, 715, 717–720, 722; 165/80.2, 80.3, 80.4, 185; 174/16.1, 16.3; 257/706, 707, 712–714, 721, 722

[56] References Cited

U.S. PATENT DOCUMENTS

| | | |
|---|---|---|
| 3,582,805 | 6/1971 | Kliphuis . |
| 3,778,551 | 12/1973 | Grodinsky . |
| 3,934,208 | 1/1976 | Getsinger et al. . |
| 4,459,638 | 7/1984 | Brehm et al. ............................ 361/697 |
| 4,674,704 | 6/1987 | Altoz et al. .............................. 361/690 |
| 4,685,081 | 8/1987 | Richman . |
| 4,812,733 | 3/1989 | Tobey . |
| 4,931,904 | 6/1990 | Yiu .......................................... 361/695 |
| 4,935,864 | 6/1990 | Schmidt et al. ......................... 363/141 |
| 5,072,332 | 12/1991 | Abe . |
| 5,079,618 | 1/1992 | Farnworth . |
| 5,157,352 | 10/1992 | Chickanosky, Jr. et al. . |
| 5,297,005 | 3/1994 | Gourdine ................................ 361/697 |
| 5,394,936 | 3/1995 | Budelman .......................... 165/104.33 |
| 5,457,342 | 10/1995 | Herbst, II . |
| 5,501,076 | 3/1996 | Sharp, III et al. ......................... 62/3.6 |
| 5,676,199 | 10/1997 | Lee . |
| 5,828,549 | 10/1998 | Gandre et al. ........................... 361/695 |

*Primary Examiner*—Leo P. Picard
*Assistant Examiner*—Boris L. Chervinsky
*Attorney, Agent, or Firm*—Jacobson, Price, Holman & Stern, PLLC

[57] ABSTRACT

A car amplifier has a housing for containing a circuit board retaining electronic components, and a cooling unit. The cooling unit draws heat away from heat generating elements which are mounted on the circuit board. The cooling unit has two heats sinks formed as first and second tunnels. The first tunnel has an arm that contacts the heat generating elements and draws heat therefrom. Each tunnel forms an interior passage and has open ends. Fins are located on the interior of the tunnels, so that heat is dissipated to the interior passages. A fan is mounted to one end of each tunnel to force air out from the passage of the first tunnel and draw the air back along through the passage of the second tunnel and to the exterior of the housing. The tunnels are separated by a peltier device, which has a cool side abutting the first tunnel and a hot side abutting the second tunnel. Hence, the cool side cools the first tunnel, while transferring heat to the second tunnel. The cooling effect of the peltier device is maximized by positioning the peltier device toward one end of the tunnels. Thus, cooled air from the first tunnel is circulated along the length of the first tunnel and drawn back through the length of the second tunnel. In addition, the hot side of the peltier device is located near the end of the second tunnel, so that heat is immediately exhausted.

20 Claims, 5 Drawing Sheets

CAR AMPLIFIER INCORPORATING A PELTIER DEVICE FOR COOLING

BACKGROUND OF THE INVENTION

1. Field of the Invention

The present invention relates to a device for cooling electronic components that generate heat. More particularly, the present invention relates to audio amplifiers, particularly a car amplifier, incorporating a peltier device for dissipating the heat generated by certain electronic components.

2. Description of the Related Art

Audio amplifiers typically employ electronic components that generate a substantial level of heat, notorious of which are transistors. As the current flowing through the transistor increases, so does the amount of heat that is generated. If the transistors overheats, the transistor may burn out or, if the amplifier has a safety switch, the amplifier will shut down until the device has cooled off.

Conventional amplifiers, such as shown in U.S. Pat. No. 3,778,551 to Grodinsky, have used heat sinks in order to cool the transistors. In Grodinsky, heat sinks having fins are mechanically secured to the transistors. The heat sink is in thermal contact with the transistor in order to draw heat away from the transistor. The heat is then passed out through the fins and exits through air vents in the housing of the amplifier. Heat sinks used for car amplifiers generally form part of the external housing of the amplifier. Accordingly, these heat sinks dissipate heat directly to the exterior of the amplifier housing usually located in a confined area such as the car trunk where ventilation is poor. Consequently, as the heat sink increases in temperature, it may cause injury if contacted.

Peltier devices are generally known to comprise a circuit having two sides formed of dissimilar metals, or a metal and a semiconductor, combined at a junction. As direct current is passed through the circuit, one side gives off heat and is cooled and the other side absorbs heat and becomes hot.

Peltier devices have been used, for instance in U.S. Pat. No. 5,457,342 to Herbst, II ("Herbst"), to cool an integrated chip of a computer. A heat conductive base plate is placed against the integrated chip to be cooled. The cooling surface of the peltier device is secured to the heat conductive base plate and the heating surface is secured to a heat sink. Heat is transferred from the integrated chip, through the base plate and peltier device, to fins on the heat sink. A fan is then secured to the fins of the heat sink to draw heated air away from the heat sink.

The peltier device of Herbst, however, is essentially limited to cooling a single heat generating element. Peltier devices have not been integrated into heat sink systems for cooling multiple heat generating components, such as the electronic components, e.g., found in car audio amplifiers.

It has now been found that peltier devices combined with more conventional heat sinks rapidly and effectively cool such devices without producing high temperature in elements that can initiate fires or burn a person who accidentally contacts products of this nature and prevent the amplifier from shutting off due to thermal protection circuit.

SUMMARY OF THE INVENTION

It is a primary object of the present invention to provide an electronic device having an improved cooling system. It is a further object of the invention to provide a car audio amplifier incorporating a heat sink system including a peltier device for cooling transistors and other heat generating elements. A further object of the invention is to provide a car amplifier having an internal cooling unit that will not cause burning when touched. It is yet another object of the invention to provide effective cooling of multiple heat generating transistors of a car audio amplifier. It is still yet another object of the invention to provide a lightweight and compact cooling system that is suitable for use in car audio amplifiers.

These together with other objects and advantages which will become subsequently apparent reside in the details of construction and operation as more fully hereinafter described and claimed, reference being had to the accompanying drawings forming a part hereof.

In accordance with these objectives, the present invention generally comprises a car amplifier having a circuit board for retaining the electronic components of the amplifier, and a cooling unit. Both the circuit board and the cooling unit are mounted within a housing of the car amplifier. The cooling unit draws heat away from heat generating elements which are mounted on the circuit board.

More particularly, the cooling unit has two heats sinks formed as first and second tunnels. The tunnels are separated by a peltier device which is positioned therebetween. The first tunnel has an arm that contacts the heat generating elements and draws heat therefrom. The arm additionally has fins that dissipate some of the heat received from the heat generating elements.

Each tunnel forms an interior passage and has open ends. Fins are located on the interior of the tunnels, so that heat is dissipated to the interior passages. A fan is mounted to one end of each tunnel to force air out from the passage of the first tunnel and draw the air back along through the passage of the second tunnel and finally to the exterior of the housing.

The peltier device has a cool side and a hot side. The cool side abuts the first tunnel, while the hot side abuts the second tunnel. Hence, the cool side cools the first tunnel, while transferring heat to the second tunnel. The cooling effect of the peltier device is maximized by positioning the peltier device toward one end of the tunnels. Thus, cooled air from the first tunnel is circulated along the length of the first tunnel and drawn back through the length of the second tunnel. In addition, the hot side of the peltier device is located near the end of the second tunnel, so that heat is immediately exhausted.

BRIEF DESCRIPTION OF THE DRAWINGS

FIG. 5 is a top view of the side panel of the car amplifier housing having air vents and slots.

DETAILED DESCRIPTION OF THE PREFERRED EMBODIMENTS

Figure 1:
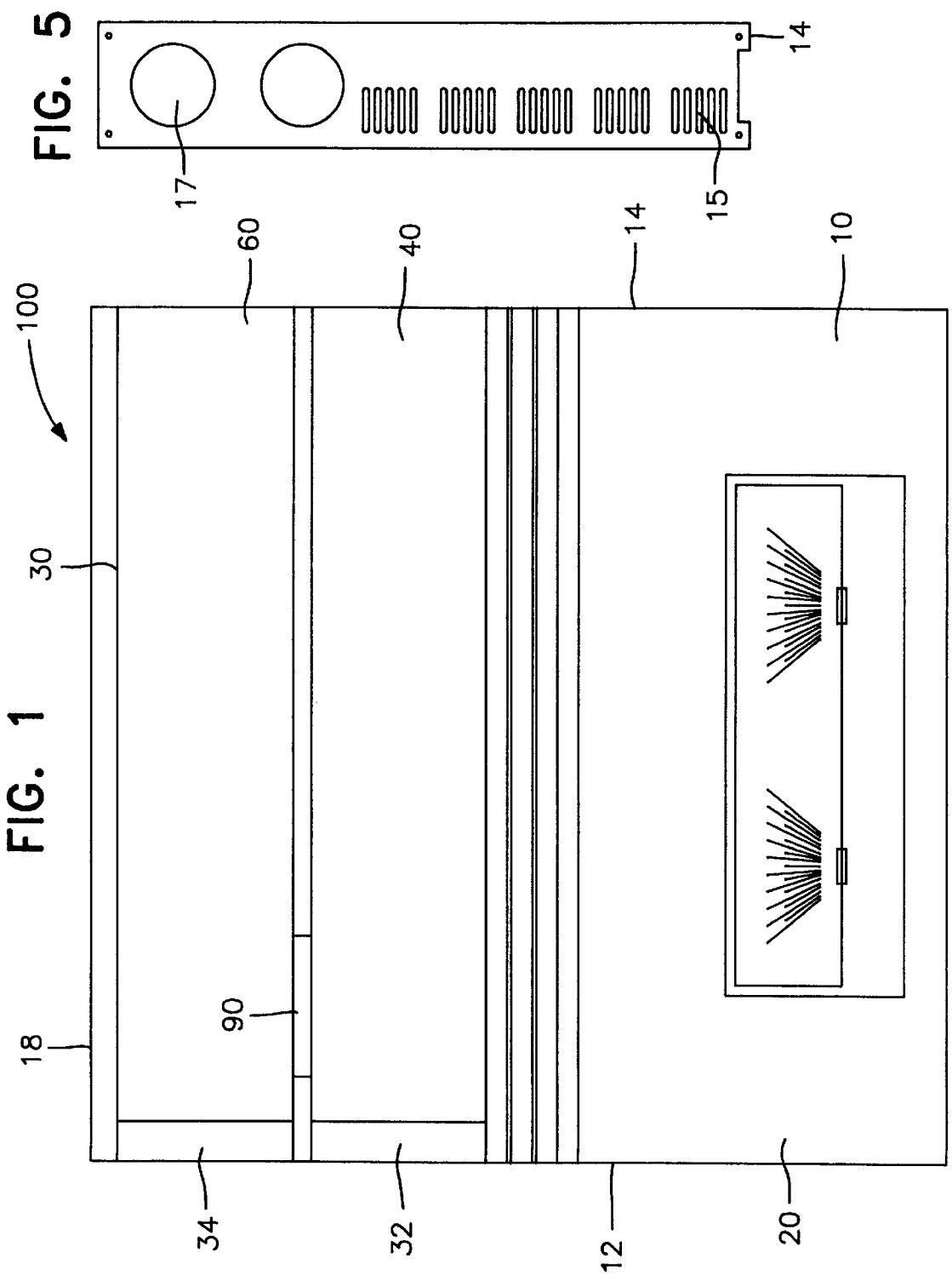
FIG. 1 is a top view of one embodiment of a car amplifier having a cooling unit in accordance with the present invention.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar purpose.

Turning to the drawings, FIG. 1 shows a car amplifier 100 having a housing 10 and a cooling unit 30. The housing 10 is the sum of left and right side panels 12, 14, as well as a front side 16, back side 18 and a top cover 20. The cooling unit 30 generally comprises a first and second fan 32, 34, a first tunnel 40, a second tunnel 60, and a peltier device 90. In the embodiment of FIG. 1, the first and second tunnels 40, 60 are shown located parallel to and toward the back end 18 of the housing 10. However, the tunnels may be arranged in any suitable position.

Figure 2:
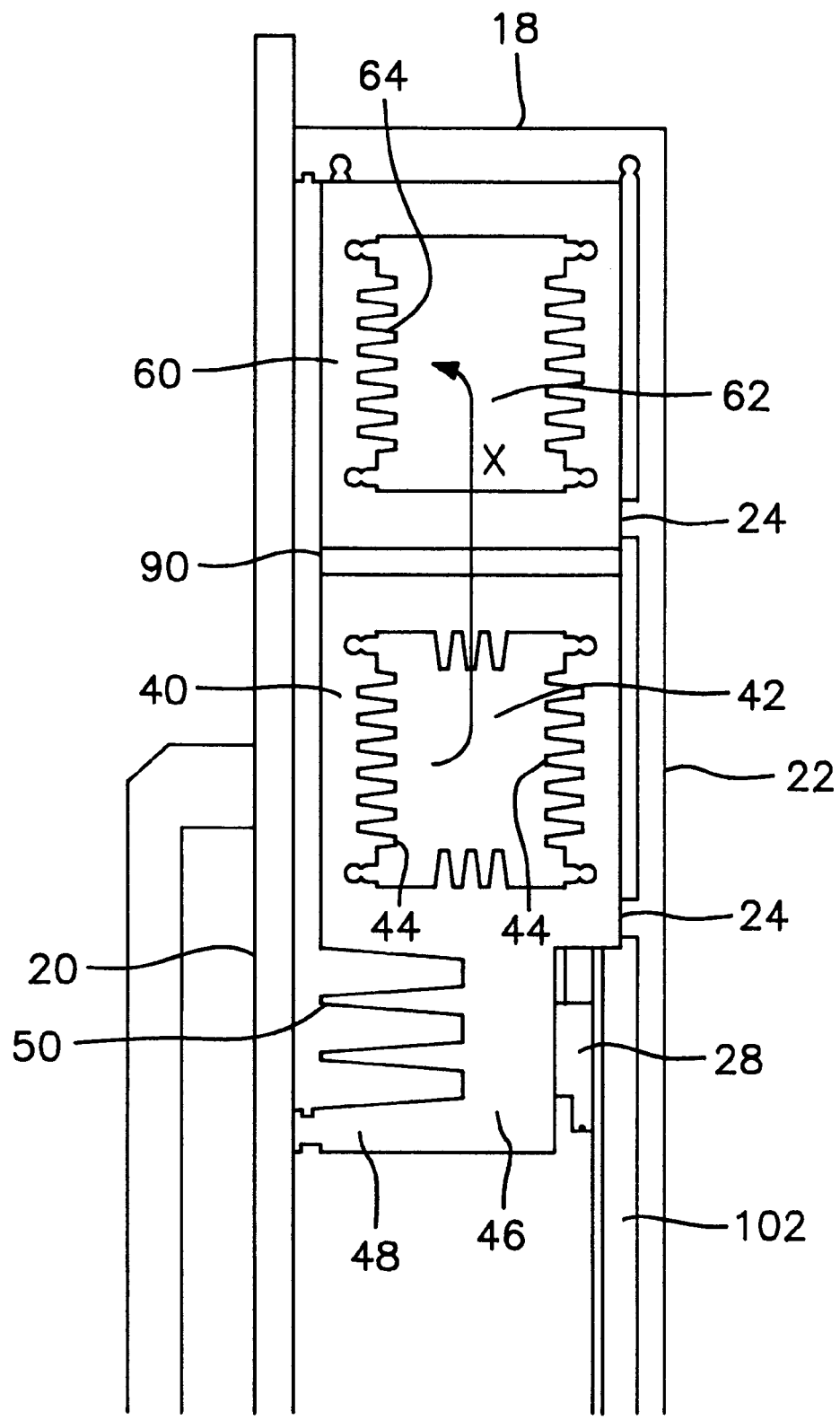
FIG. 2 is a fragmentary cut-away side view of the car amplifier of FIG. 1.
Figure 3:
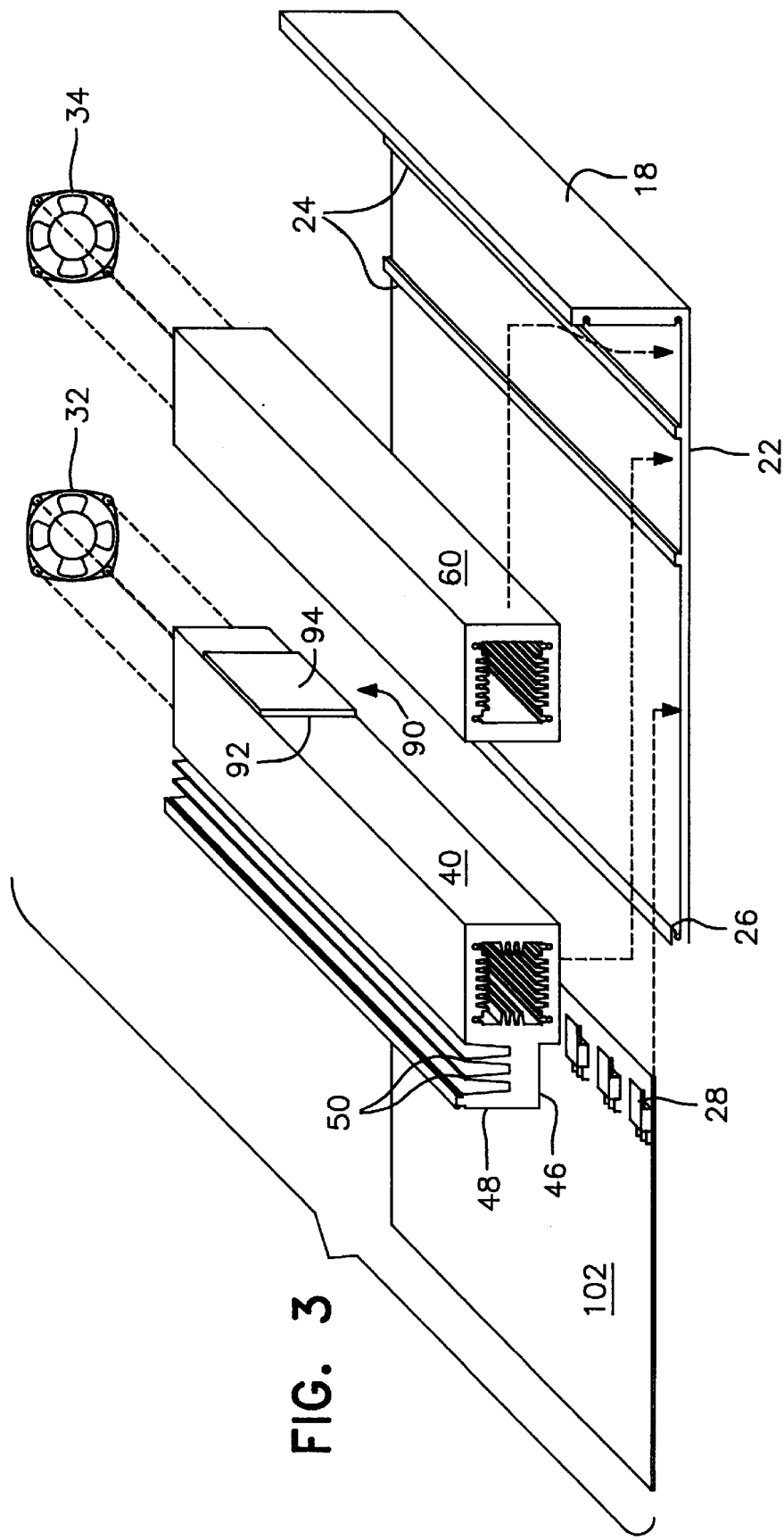
FIG. 3 is an exploded perspective view of the tunnel-shaped heat sinks.
Figure 4:
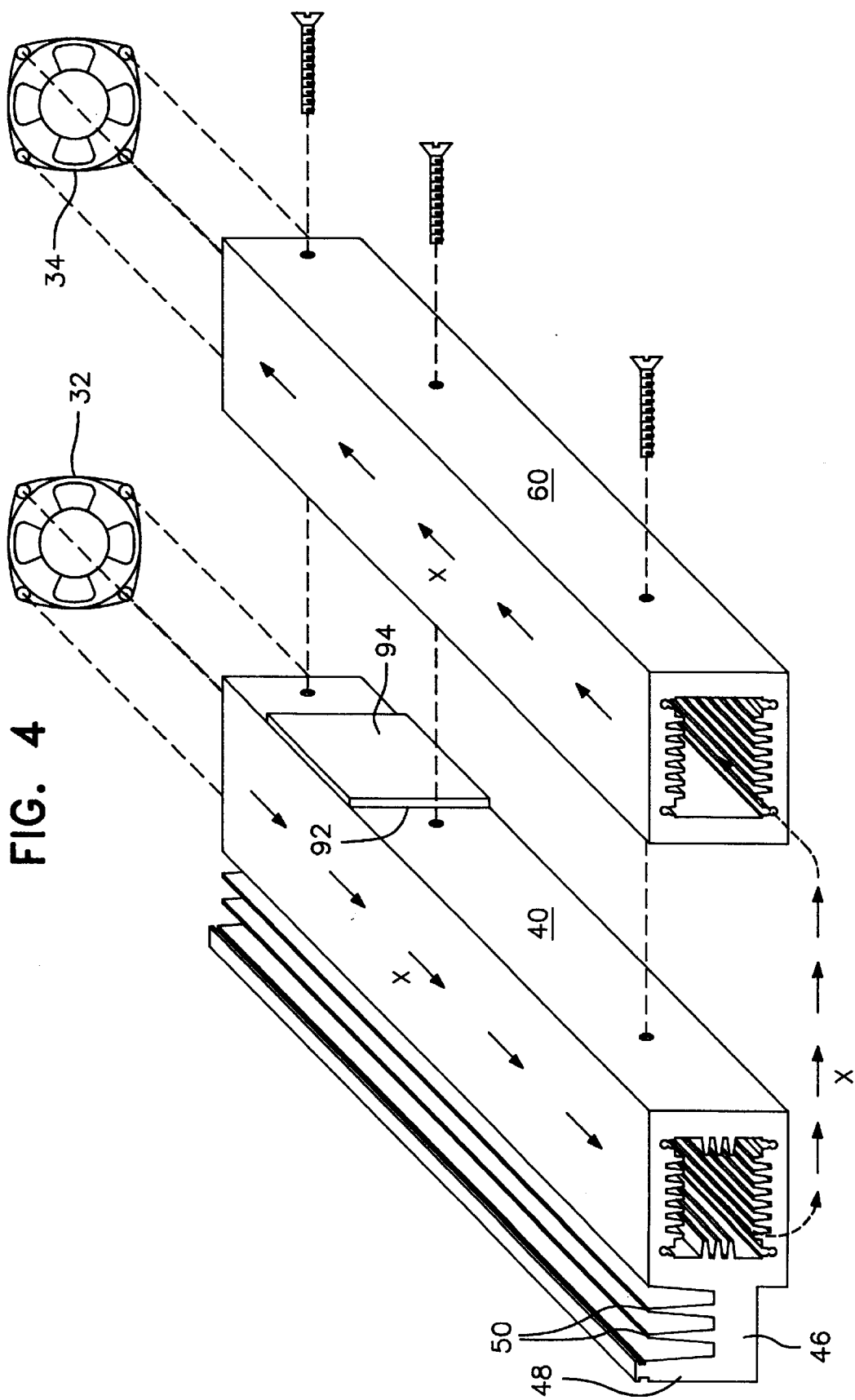
FIG. 4 is a perspective view of the tunnels showing the direction air travels through the tunnel passages.

As shown in FIGS. 2–4, tunnels 40, 60 are generally elongated members having a rectangular cross-section and forming interior passages 42, 62. Tunnels 40, 60 further have smooth exterior surfaces and interior surfaces formed of inwardly-projecting fins 44, 64. The fins 44, 64 extend the entire length of tunnels 40, 60, respectively.

Although fins 44 are located on each of the four interior sides of tunnel 40, fins 64 are preferably only located along top and bottom of tunnel 60. Fins are not provided on the left and right sides of tunnel 60 (as shown in the embodiment of FIGS. 2–4), so that holes may be drilled to receive screws used to mount the tunnel 60 to the housing. The presence of fins may cause the drill bit to wander. Of course, fins may be provided along the left and right sides of tunnel 60, with small channels provided for the screw holes.

As further shown in FIGS. 1, 2 and 3, the housing 10 is formed from a single L-shaped body forming the back 18 and bottom 22 of the amplifier 100. The bottom 22 of the housing further has two mounting guides or elements 24 that create a space between tunnels 40, 60 and the bottom 22 of the housing 10. Thus, the tunnels 40, 60 are separated from the main housing frame 10 to thermally insulate the tunnels so that heat is not transferred to the housing 10. Thus, the housing 10 of amplifier 100 will not be hot to the touch, and will not cause burning.

A circuit board 102 containing the electrical circuitry of the amplifier 100 is secured between guide 24 and a lip 26 at the front 16 of the housing 10. The heat generating components 28, mostly transistors, are placed along an edge of the circuit board located closest to the first tunnel 40. Once the circuit board 102, and then the tunnels 40, 60, are positioned within the mounting guides 24 and lip 26 of the housing 10, the front 16 and cover 20 are secured in position.

The first tunnel 40 has an arm 46 that extends out perpendicular from one side of the tunnel 40. The arm 46 has a right angle forming a finger 48, with elongated fins 50 located between the finger 48 and the side of the tunnel 40. The end of finger 48 is configured to underlie the top cover 20. The finger 48 forms a thermal seal to reduce the amount of heat passing from the fins 50 to the area of the housing having the circuit board.

The arm 46 is designed to extend over, and come into contact with, the heat generating components 28. Tunnels 40, 60 are heat sink elements designed to draw heat away from transistors 28 to the exterior vents 17 of housing 10. Accordingly, heat is absorbed by arm 46 and passed out by fins 50 of arm 46. Heat passing out of fins 50 exit the housing via elongated slots 15 located in side panel 14, as best shown in FIG. 5.

Primarily, however, heat absorbed by arm 46 is conducted to the tunnel 40 and out through fins 44 to the interior passage 42 of the first tunnel 40. Accordingly, by providing fins 44, 64 on the interior sides of tunnels 40, 60, heat is directed into the passages 42, 62. Thus, only a limited amount of heat enters the cavity of the housing 10, which may exit through vents 15 in the side panel 12 and 14 (see FIG. 5).

The peltier device 90 has a cool side 92, which is preferably secured to the first tunnel 40, and a hot side 94, which is preferably secured to the second tunnel 60. Accordingly, the first tunnel 40 is the "cool" tunnel and the second tunnel 60 is the "hot" tunnel.

Turning to FIG. 4, the peltier device 90 is secured between the tunnels 40, 60. The first tunnel 40 is fastened to the second tunnel 60 by anchor screws that extend through openings located in the side walls of tunnel 40, as well as the interior passage 62. The screws are retained by receiving holes located in the first tunnel 40. The peltier device 90 is then greased with silicon for maximum heat transfer and squeezed between the attached tunnels 40, 60. The friction fit retains the peltier device 90 in position, but allows the peltier device to be removed for repair or replacement.

The cool side 92 of the peltier device 90 primarily cools the aluminum tunnel and the heated air that is created by heat passing out from fins 44 to passage 42. The cooled air is then blown out of the first tunnel 40 by fan 32, which draws air in from vent 17 located in the side panel 12 of the housing 10 (FIG. 5). Preferably, the fan 32 is located on the open end of the tunnel 40 closest to the peltier device 90 so that the cooled air will travel the length of the tunnel 40. In addition, the cool side 92 of the peltier device 90 serves to draw heat directly from the first tunnel 40, which is then transferred immediately to the second tunnel 60.

In addition, a second fan 34 is positioned at the open end of the second tunnel 60 nearest peltier device 90. As cooled air exits the passage 42 of the first tunnel 40, the second fan 34 draws the air through the interior passage 62 of the second tunnel 60. The flow of air is shown by the arrow X in FIGS. 2 and 4.

The cooled air is heated by the second tunnel 60 as it travels through the interior passage 62. The heated air is then passed out of the housing 10 via vents 17 located in the side panel 12 (FIG. 5) and fitted with gratings. In order to assist the recirculation of air from the first passage 42 to the second passage 62, however, the right side panel 14 is preferably closed.

Since the hot side 94 is positioned close to the fan 34, the air will be substantially heated just before being exhausted to the exterior of the housing 10. Accordingly, the cooling effect of the peltier device 90 is maximized by allowing the cooled air to travel the length of each of the tunnels 40, 60 prior to encountering the hot side 94 of the peltier device 90. In addition, by locating the hot side 94 close to the exhaust fan 34, the heat created by transistors 28 is concentrated just before being exhausted.

The tunnels 40, 60 are separated from each other so that they are thermally isolated. Hence, the only transfer of heat between the first and second tunnel occurs via the peltier device 90. Accordingly, the cool air generated by the peltier device 90 may be recirculated through the higher temperature tunnel 60 to obtain additional temperature management.

In the preferred embodiment, the peltier device 90 has ceramic surfaces forming the cool and hot sides 92, 94. The device 90 is about 0.161 inches thick, 1.582 inches wide and 1.582 inches high. Peltier devices are readily available on the marketplace. The use of the peltier device 90 substantially reduces the requisite length of fins 44, 64. Fins 44, 64 are about 0.20 inches in height and fins 50 are about 0.80 inches in height. The peltier device preferably has a fixed voltage input in the range of 12–25 volts, depending upon the desired cooling to be attained.

The tunnels 40, 60 are formed of aluminum and are about 2.00 inches wide and 1.60 inches in height. The length of tunnels 40, 60, however, vary depending upon the amount of heat dissipation needed in relation to the current generated in the power supply section. For an amplifier 100 having 25 Watts per channel amplification at four Ohms, the tunnels 40, 60 are about 11 inches in length. However, for 50 Watts per channel at four Ohms, the tunnels are about 16 inches in length.

Preferably, however, two amplifiers are located within a single housing 10 to form four channel amplification. Twin peltier devices 90 are used, one located at each end of the first tunnel 40 at a location near a power transformer. In this embodiment, the tunnels 40 are about 22 inches in length.

The cooling unit 30 results in an approximately 60–70 degree drop in temperature from the ambient temperature of the amplifier. The actual cooling will vary depending upon the power being exerted compared to the size of the heatsinks and ambient temperatures. Still another factor affecting the actual cooling is the load or impedance of the speakers on the amplifier.

Car amplifiers typically shut down when the amplifier reaches a temperature of about 165 degrees in order to prevent harm to the amplifier. The ambient temperature of the amplifier, on the other hand, may reach 140 degrees or more, especially during the summer and for amplifiers that are located within the trunk of a car. Accordingly, the cooling unit 30 is configured to prevent the amplifier from reaching 165 degrees under most conditions.

One aesthetic advantage of the present invention is that the cooling unit 30 is entirely located internally within housing 10. In addition, by locating the cooling unit 30 within the housing 10, the housing 10 of the amplifier 100 is thermally isolated so that the housing 10 will not burn a person that comes into contact with the amplifier.

In addition, although the peltier device 90 is positioned toward the left side 12 of the housing 10, it may also be positioned toward the right side 14 of the amplifier 100 or as otherwise suitable. Likewise, although only a single peltier device 90 is used in the preferred embodiment, any number of peltier junctions may be utilized.

Figure 6:
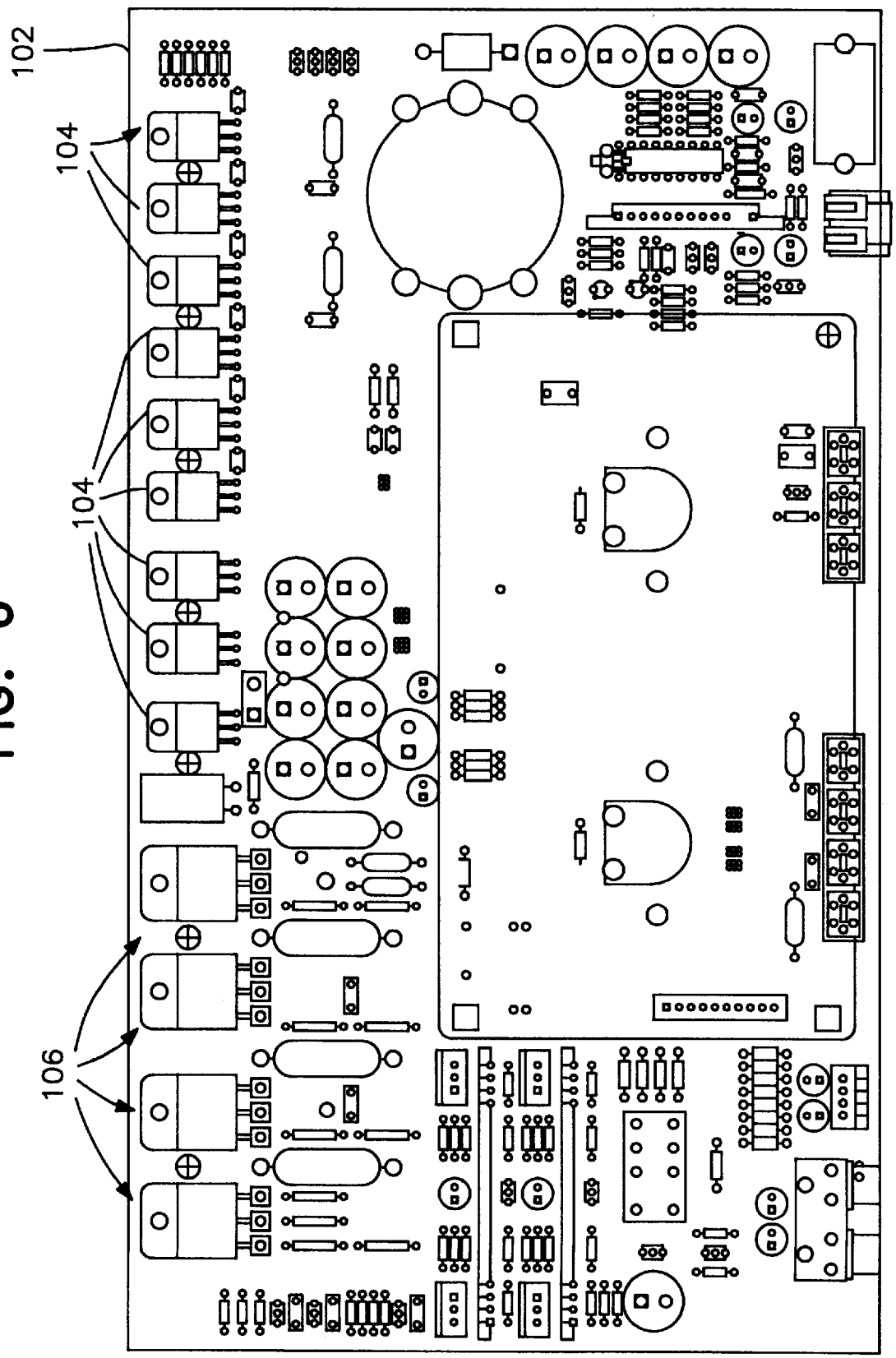
FIG. 6 is a circuit board diagram showing the electronic components for use in a car amplifier.

A more detailed arrangement of the electronic components is shown in the preferred embodiment of FIG. 6. The circuit board 102 is arranged with MOSFETs 104 and bipolar outputs 106 positioned along one edge of the board 102. The elements 104, 106 require heat relief, and come into contact with the arm 46 of tunnel 40 when the amplifier 100 is fully assembled.

The foregoing descriptions and drawings should be considered as illustrative only of the principles of the invention. Numerous applications of the present invention will readily occur to those skilled in the art. Therefore, it is not desired to limit the invention to the specific examples disclosed or the exact construction shown and operation shown and described. Rather, all suitable modifications and equivalents may be resorted to, falling within the scope of the invention.

We claim:

1. A cooling unit for electronic devices having a heat generating element, the cooling unit comprising:
    a first heat sink comprising a first tunnel having a first internal passage and internal fins for transferring heat to the first internal passage, the first tunnel thermally connected to receive heat from the heat generating element;
    a second heat sink comprising a second tunnel having a second internal passage and internal fins for transferring heat to the second internal passage;
    a cooling element having a first side thermally connected to the first heat sink for cooling the first heat sink, and a second side thermally connected to the second heat sink for heating the second heat sink;
    a first fan connected at one end of the first tunnel for pushing cooled air through the first internal passage to exit at an opposite end of the first tunnel; and,
    a second fan connected at one end of the second tunnel for drawing cooled air exiting the first tunnel through the second internal passage and for exhausting air from the second tunnel.

2. The cooling unit of claim 1, further comprising an arm located on the first tunnel, the arm contacting the heat generating elements of said electronic device.

3. The cooling unit of claim 2, further comprising fins located on said arm for dissipating heat.

4. The cooling unit of claim 1, wherein the cooling element comprises a peltier junction.

5. The cooling unit of claim 1, wherein the cooling element is connected between the first and second tunnels to transfer heat therebetween.

6. The cooling unit of claim 1, wherein the first tunnel is thermally isolated from the second tunnel.

7. The cooling unit of claim 1, wherein each of the first and second tunnels have interior surfaces forming fins that dissipate heat into the first and second passages, respectively.

8. In combination, an electronic device and a cooling unit according to claim 1, wherein the electronic device has a housing, the cooling unit thermally isolated from the housing.

9. In combination, an electronic device and a cooling unit according to claim 1, wherein the cooling unit is fully enclosed within a housing of said electronic device.

10. In combination, an electronic device and a cooling unit according to claim 1, wherein the electronic device comprises a car amplifier.

11. An electronic device having a heat generating component, the device comprising a housing for internally retaining heat sinks formed as first and second tunnels having respective first and second internal passages, the first tunnel connected to the heat generating component to conduct heat away from the heat generating component, a cooling element positioned between the first and second tunnels to transfer heat from the first tunnel to the second tunnel, and a circulator for drawing air located in each of the first and second tunnels to an exterior of the housing.

12. The electronic device of claim 11, further comprising at least one fan for drawing air located in the first internal passage through the second internal passage and exhausting to an exterior of the housing.

13. The electronic device of claim 11, the housing further having mounts for thermally isolating the first and second tunnels from the housing.

14. The electronic device of claim 11, further comprising an arm located on the first tunnel, the arm contacting the heat generating elements of said electronic device.

15. The electronic device of claim 11, further comprising fins located on said arm for dissipating heat.

16. The electronic device of claim 11, wherein the cooling element comprises a peltier junction.

17. The electronic device of claim 11, wherein the cooling element is connected between the first and second tunnels to transfer heat therebetween.

18. The electronic device of claim 11, wherein the first tunnel is thermally isolated from the second tunnel.

19. The electronic device of claim 11, wherein each of the first and second tunnels have interior surfaces forming fins that dissipate heat into the first and second passages, respectively.

20. The electronic device of claim 11, wherein the electronic device comprises a car amplifier.

\* \* \* \* \*